United States Patent
Sato

[11] Patent Number: 5,875,204
[45] Date of Patent: Feb. 23, 1999

[54] TEMPERATURE-CONTROLLED SEMICONDUCTOR LASER APPARATUS AND TEMPERATURE CONTROL METHOD THEREFOR

[75] Inventor: Kazuyoshi Sato, Tokyo, Japan

[73] Assignee: NEC Corporation, Tokyo, Japan

[21] Appl. No.: 694,159

[22] Filed: Aug. 8, 1996

[30] Foreign Application Priority Data

Aug. 18, 1995 [JP] Japan .................................. 7-210888

[51] Int. Cl.⁶ .................................................. H01S 3/043
[52] U.S. Cl. .............................................. 372/34; 372/36
[58] Field of Search ......................................... 372/36, 34

[56] References Cited

U.S. PATENT DOCUMENTS

| | | | |
|---|---|---|---|
| 5,181,214 | 1/1993 | Berger et al. | 372/34 |
| 5,216,544 | 6/1993 | Horikawa et al. | 372/34 |
| 5,266,803 | 11/1993 | Heffelfinger | 250/582 |
| 5,267,252 | 11/1993 | Amano | 372/34 |
| 5,341,388 | 8/1994 | Masuda et al. | 372/36 |
| 5,399,877 | 3/1995 | Carter et al. | 250/581 |
| 5,446,750 | 8/1995 | Ohtsuka et al. | 372/34 |

*Primary Examiner*—James W. Davie
*Attorney, Agent, or Firm*—Scully, Scott, Murphy & Presser

[57] ABSTRACT

A temperature-controlled semiconductor laser apparatus includes a semiconductor laser element, an optical fiber, a temperature controller, a thermistor, and a package. The semiconductor laser element emits a laser beam. The optical fiber receives the laser beam emitted from the semiconductor laser element. The temperature controller cools and heats the semiconductor laser element to keep the semiconductor element at a preset temperature. The thermistor detects an ambient temperature of the semiconductor laser element. The package accommodates at least the semiconductor laser element and the temperature controller in a sealed state and having the thermistor mounted on an inner wall of the package.

10 Claims, 9 Drawing Sheets

TEMPERATURE-CONTROLLED SEMICONDUCTOR LASER APPARATUS AND TEMPERATURE CONTROL METHOD THEREFOR

BACKGROUND OF THE INVENTION

The present invention relates to a semiconductor laser apparatus used in optical communications and optical information processing and, more particularly, to a temperature-controlled semiconductor laser apparatus whose temperature can be controlled using a temperature controller and a temperature detection thermistor, and a temperature control method therefor.

A combination of a temperature controller using Peltier elements and a thermistor for detecting the temperature of a portion closest to a semiconductor laser mounting portion to perform temperature control of a semiconductor laser element is popularly used as a conventional temperature-controlled semiconductor laser apparatus. An arrangement used in a conventional temperature-controlled semiconductor laser apparatus will be described below.

Figure 9:
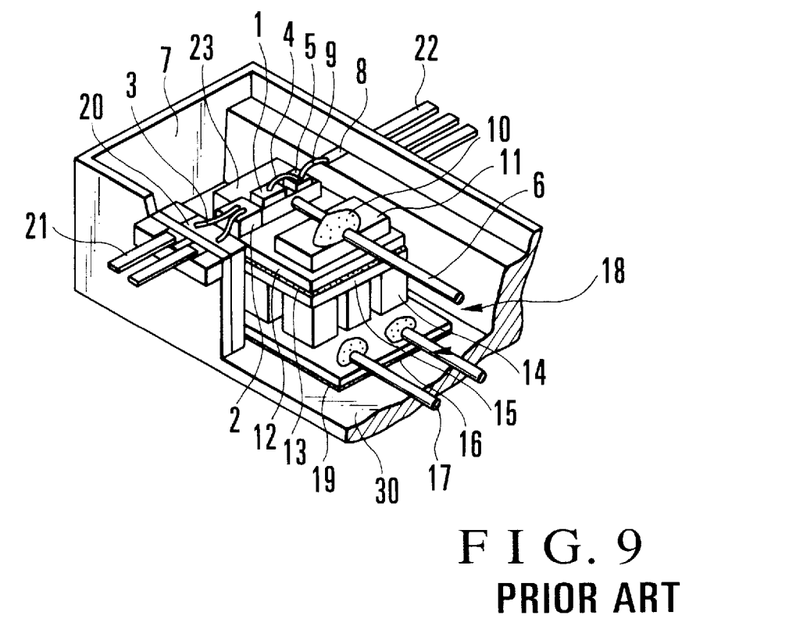
FIG. 9 is a perspective view showing the arrangement of a conventional temperature-controlled semiconductor laser module.

FIG. 9 shows an arrangement of a conventional temperature-controlled semiconductor laser module. As shown in FIG. 9, a semiconductor laser element 1 and an island 5 are soldered (not shown) on a heat sink 23. The heat sink 23 is soldered (not shown) on a carrier 12. The thermistor 2 is soldered (not shown) on the carrier 12 near the semiconductor laser element 1.

A block 11 is soldered (not shown) to the carrier 12. A solder coating is formed on the outer surface of an optical fiber 6 and is fixed to the block 11 with a soldered portion 10 at a position where light emitted from the semiconductor laser element 1 is incident on the optical fiber 6.

Lead wires 17 of a temperature controller 18 are electrically connected to the lead terminals (not shown) of a package 7 to obtain external connections. The temperature controller 18 comprises Peltier elements 14, an upper substrate 15, a lower substrate 16, and the lead wires 17.

Figure 11:
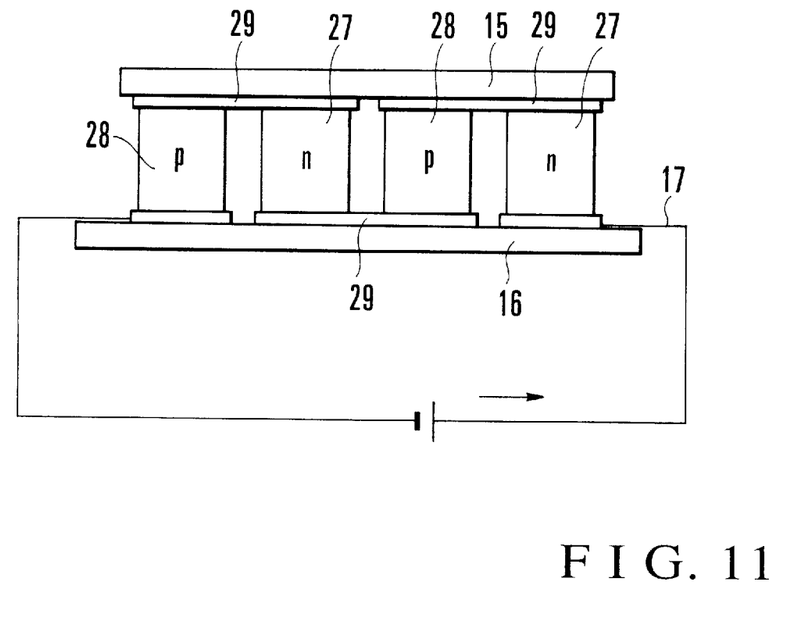
FIG. 11 is an electrical schematic of the temperature controller of FIG. 1 and 9.

The basic principle of the temperature controller 18 will be described below. As shown in FIG. 11, n- and p-type semiconductor layers 27 and 28 are bonded between the upper substrate 15 and the lower substrate 16. The plurality of pairs of n- and p-type semiconductor layers 27 and 28 are connected to upper and lower soldered portions 29 in a staggered manner between the upper and lower substrates 15 and 16 to constitute a series connection circuit. The upper and lower substrates 15 and 16 normally consist of a material such as a ceramic material so as to achieve electrical insulation.

When a DC current flows in a direction of an arrow in FIG. 11, the upper substrate 15 side on which the current flows from the n-type semiconductor layer to the p-type semiconductor layer absorbs heat, while the lower substrate 16 side on which the current flows from the p-type semiconductor layer to the n-type semiconductor layer generates heat. The temperature controller 18 utilizes a Peltier effect by causing the current to flow through the two types of bonded semiconductor layers.

The lower surface of the lower substrate 16 of the temperature controller 18 is fixed with a soldered portion 19 on a base 30 of the package. The carrier 12 is fixed on the upper surface of the upper substrate 15 through a soldered portion 13. The semiconductor laser element 1 and the island 5 are electrically connected through wires 4.

The island 5 and lead terminals 22 are electrically connected through wires 9 and a wiring pattern 8, and the thermistor 2 and lead terminals 21 are electrically connected through lead wires 3 and a wiring pattern 20.

Figure 10:
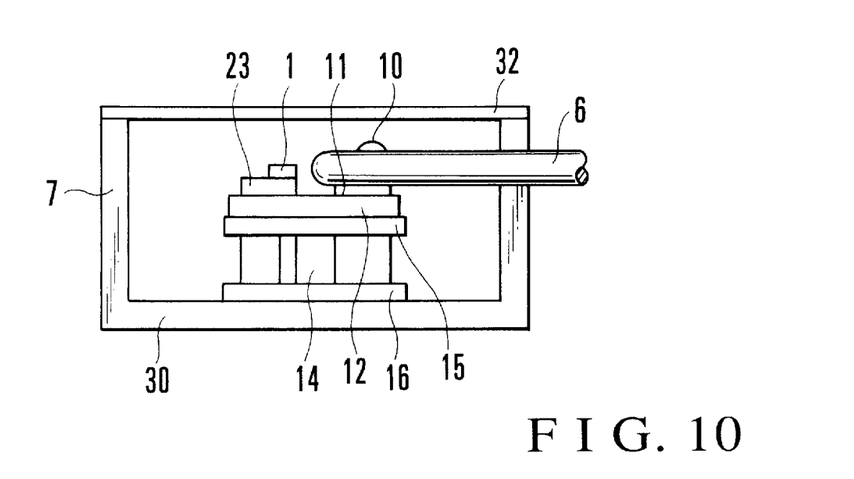
FIG. 10 is a side view of the temperature-controlled semiconductor laser module shown in FIG. 9.

After the above components are mounted, a cap 32 is welded by seam welding and sealed by the package 7 in which nitrogen gas is kept sealed, as shown in FIG. 10, thereby obtaining the conventional temperature-controlled semiconductor laser apparatus.

Temperature control of the semiconductor laser element 1 in the conventional temperature-controlled semiconductor laser apparatus will be described below. The direction and magnitude of a current supplied to the lead wires 17 are controlled in accordance with a temperature detected by the thermistor 2. By this control, the temperature of the upper substrate 15 is controlled to keep the temperature of the semiconductor laser element 1 constant.

When the temperature of the semiconductor laser element 1 which is detected by the thermistor 2 is higher than the preset temperature of the semiconductor laser element 1, a current flows in the lead wires 17 of the temperature controller 18 in a direction to cool the semiconductor laser element 1. To the contrary, when the detected temperature is lower than the preset temperature, a current flows in a direction to heat the semiconductor laser element 1. When the difference between the detected temperature of the semiconductor laser element 1 and the preset temperature is large, the value of the current is controlled to increase. When the difference is small, the value of the current is controlled to decrease.

In the conventional temperature-controlled semiconductor laser apparatus, since the thermistor 2 is fixed on the carrier 12 near the semiconductor laser e element 1 on the temperature control target side of the temperature controller 18. For this reason, a space for fixing the thermistor 2 on the carrier 12 on the temperature control target side of the temperature controller 8 must be assured. The thermistor on the temperature control target side of the temperature controller 18 must be connected to the package 7 through the lead wires 3. For this reason, heat generated outside the package 7 is transferred to the temperature control target side of the temperature controller 18, and temperature control characteristics are greatly degraded.

SUMMARY OF THE INVENTION

It is an object of the present invention to provide a temperature-controlled semiconductor laser apparatus having improved temperature control characteristics and a temperature control method therefor.

In order to achieve the above object of the present invention, there is provided a temperature-controlled semiconductor laser apparatus comprising a semiconductor laser element for emitting a laser beam, an optical fiber for receiving the laser beam emitted from the semiconductor laser element, cooling/heating means for cooling and heating the semiconductor laser element to keep the semiconductor element at a preset temperature, temperature detection means for detecting an ambient temperature of the semiconductor laser element, and accommodation means for accommodating at least the semiconductor laser element and the cooling/heating means in a sealed state and having the temperature detection means mounted on an inner wall of the accommodation means.

DESCRIPTION OF THE PREFERRED EMBODIMENT

The arrangement of a temperature-controlled semiconductor laser apparatus according to the present invention will be described with reference to the accompanying drawings.

Figure 1:
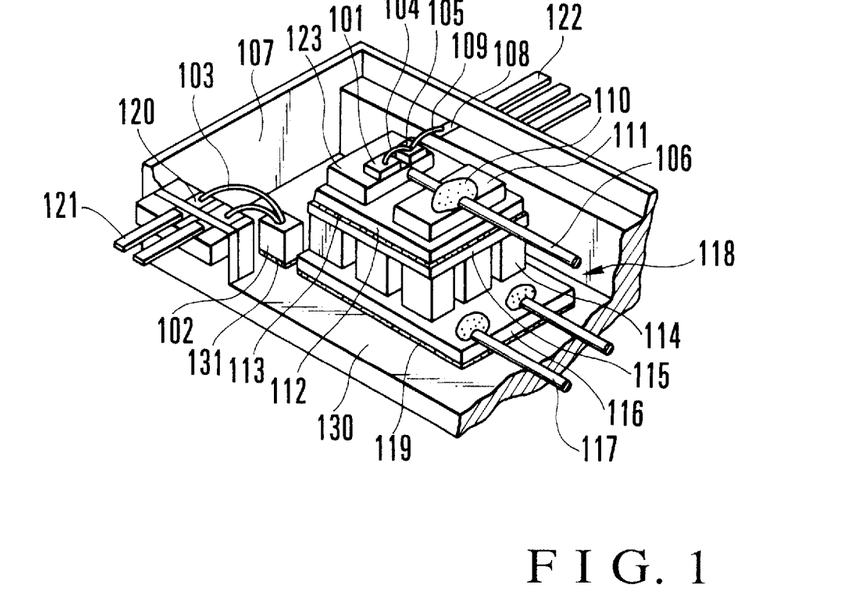
FIG. 1 is a perspective view showing a temperature-controlled semiconductor laser module according to an embodiment of the present invention.

FIG. 1 shows a temperature-controlled semiconductor laser apparatus according to an embodiment of the present invention. A semiconductor laser element 101 and an island 105 are soldered (not shown) to a heat sink 123. The heat sink 123 is soldered (not shown) to a carrier 112. A thermistor 102 is coated with a solder and fixed to a base 130 with a soldered portion 131. A block 111 is soldered (not shown) to the carrier 112. An optical fiber 106 has a solder coating on its outer surface and fixed to the block 111 with a soldered portion 110 at a position where light from the semiconductor laser element 101 is incident on the optical fiber 106.

Lead wires 117 of a temperature controller 118 serving as a cooling/heating means are electrically connected to lead terminals (not shown) of a package 107 to obtain external connections. The temperature controller 118 comprises Peltier elements 114 for performing heat generation or heat absorption depending on the direction of a current, as shown in FIG. 11, an upper substrate 115, a lower substrate 116, and the lead wires 117. The lower surface of the lower substrate 116 of the temperature controller 118 is fixed to the base 130 of the package 107 with a soldered portion 119 independently of the thermistor 102. The lower surface of the upper substrate 115 is fixed to the carrier 112 with a soldered portion 113.

More specifically, the thermistor 102 is not mounted on the carrier 112 serving as the temperature control target of the temperature controller 118, but on the base 130 near the semiconductor laser element 101 so as to detect the ambient temperature of the semiconductor laser element 101.

Figure 2:
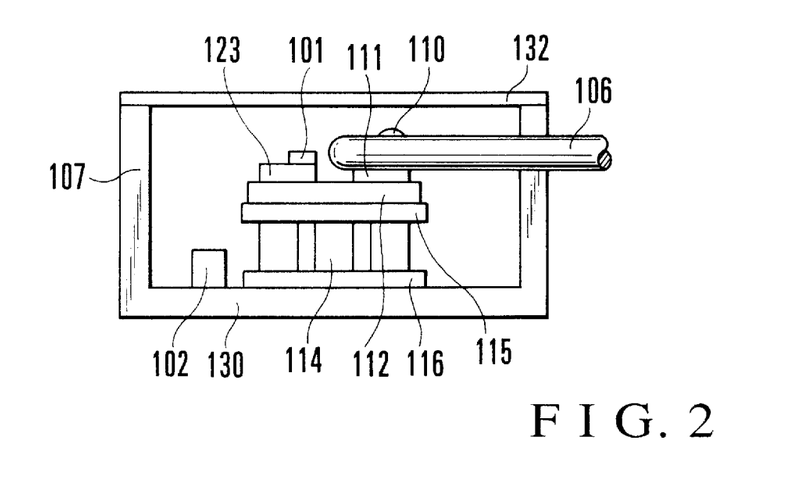
FIG. 2 is a side view of the temperature-controlled semiconductor laser module shown in FIG. 1.

The semiconductor laser element 101 and the island 105 are electrically connected through wires 104. The island 105 and lead terminals 122 are electrically connected through wires 109 and a wiring pattern 108. The thermistor 102 and lead terminals 121 are electrically connected through lead wires 103 and a wiring pattern 120. The package 107 on which the above components are mounted is welded to and sealed by a cap 132 by seam welding while nitrogen gas is sealed in the package 107, as shown in FIG. 2.

Figure 3:
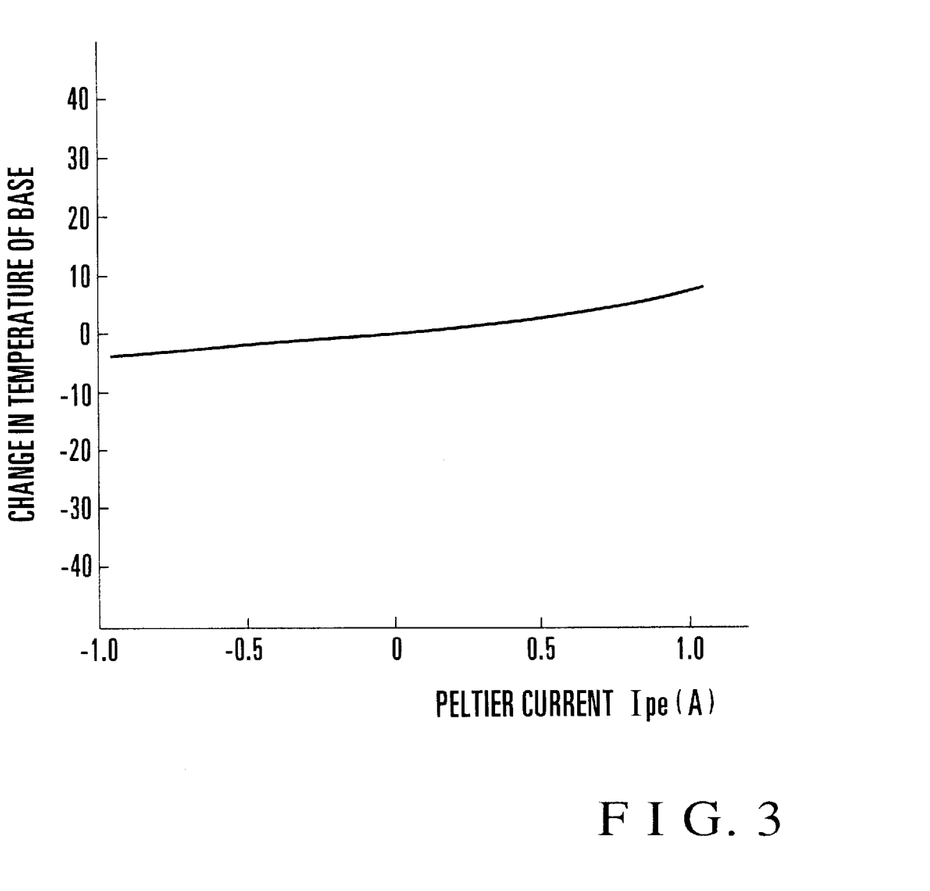
FIG. 3 is a graph showing the relationship between the Peltier current and the change in temperature of a base.
Figure 4:
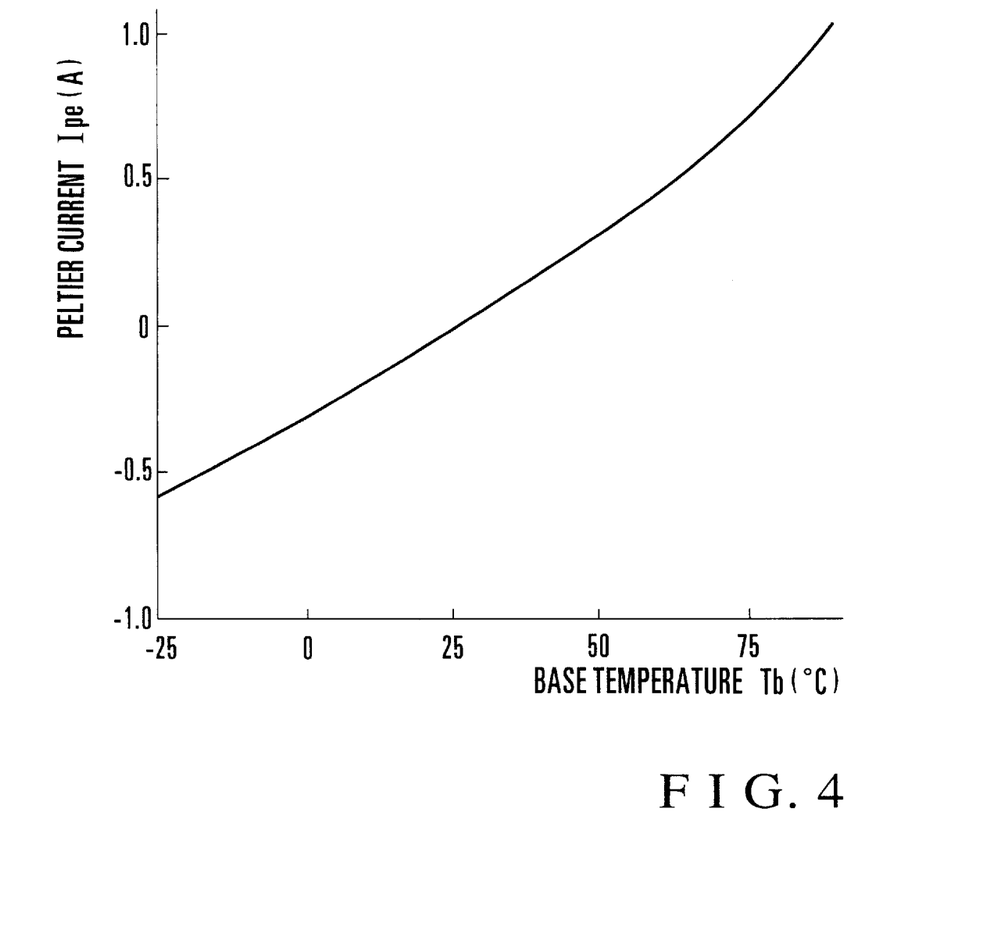
FIG. 4 is a graph showing the relationship between the base temperature and the Peltier current for keeping the temperature constant.

Temperature control of the semiconductor laser element 101 in the temperature-controlled semiconductor laser apparatus according to the present invention will be described in detail below. FIG. 3 shows changes in temperature of the base 130 upon supply of a Peltier current after a heat sink (not shown) is mounted on the base 130. FIG. 4 shows the Peltier current required to keep the temperature of the semiconductor laser element 101 constant when the ambient temperature outside the package 107 is changed to change the temperature of the base 130. The preset temperature of the semiconductor laser element 101 is defined as 25° C. The temperature of the base 130 is determined by a change in ambient temperature and a change in temperature of the base 130 upon supply of the Peltier current.

Figure 5:
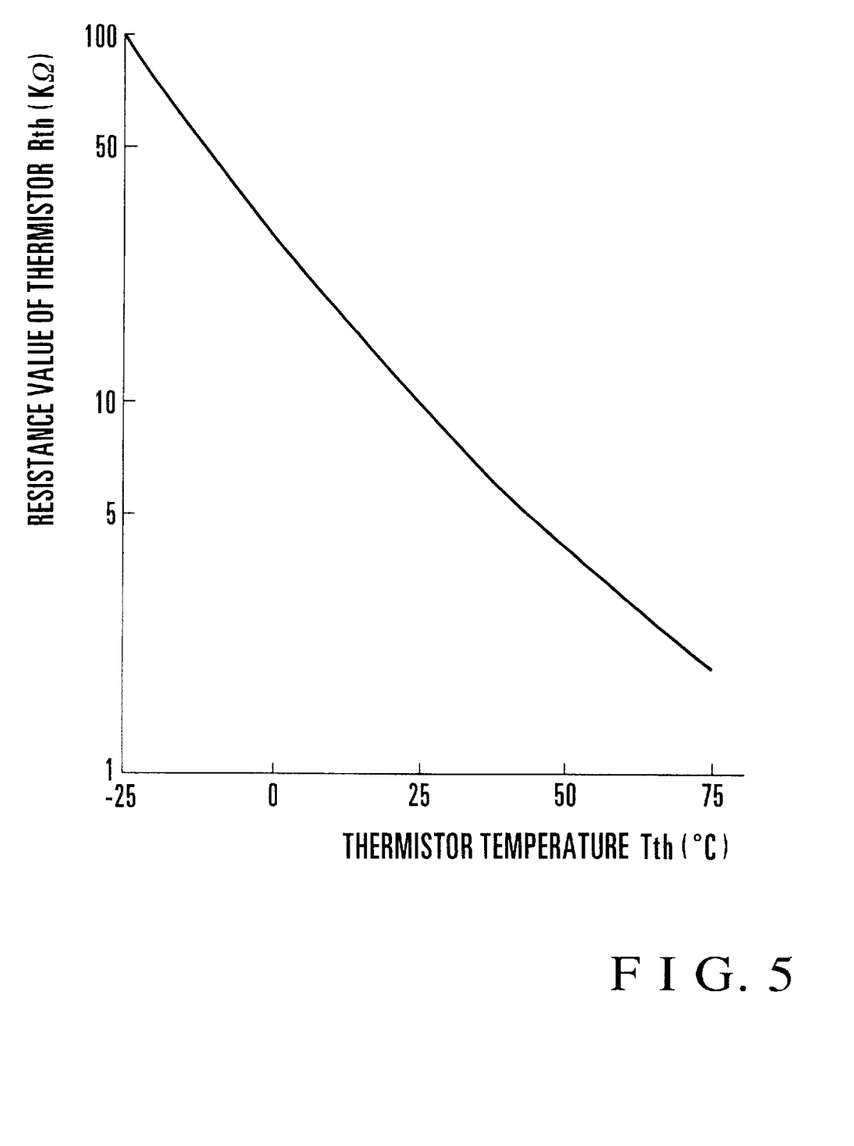
FIG. 5 is a graph showing the temperature characteristics of resistance values of a thermistor.

FIG. 5 shows the temperature characteristics of resistance values of the thermistor 102. A resistance value Rth of the thermistor is generally represented by equation (1) as a function of temperatures:

$$Rth = R0 * \exp(B*(1/T - 1/T0)) \quad (1)$$

where R0 is the resistance value of the thermistor at a temperature T0, and B is a constant.

Figure 6:
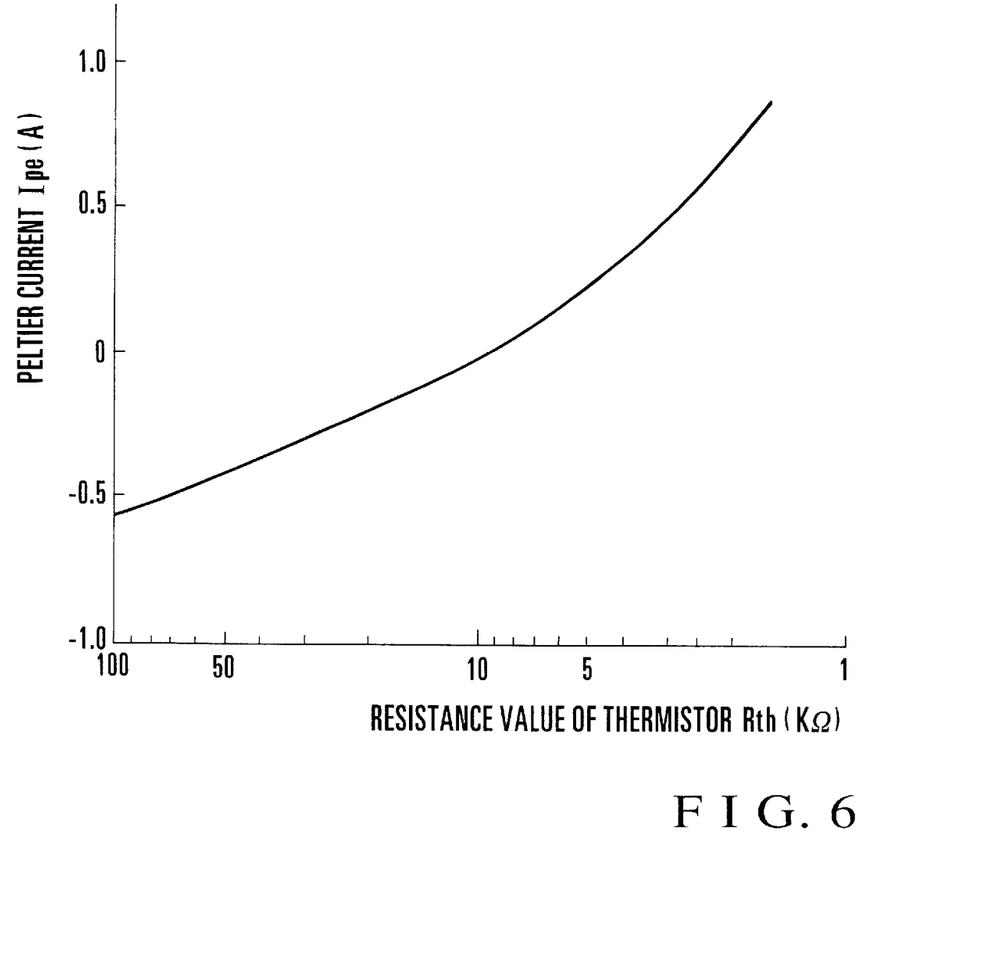
FIG. 6 is a graph showing the relationship between the resistance value of the thermistor fixed to the base and the Peltier current.

FIG. 5 shows a case in which T0 is 298 [K], R0 is 10 [kgΩ], and B is 3,450 [1/K]. Judging from FIGS. 4 and 5, the Peltier current for keeping the temperature of the semiconductor laser element 101 constant can be obtained in accordance with the detected resistance value of the thermistor 102 fixed to the base 130, as shown in FIG. 6.

Figure 7:
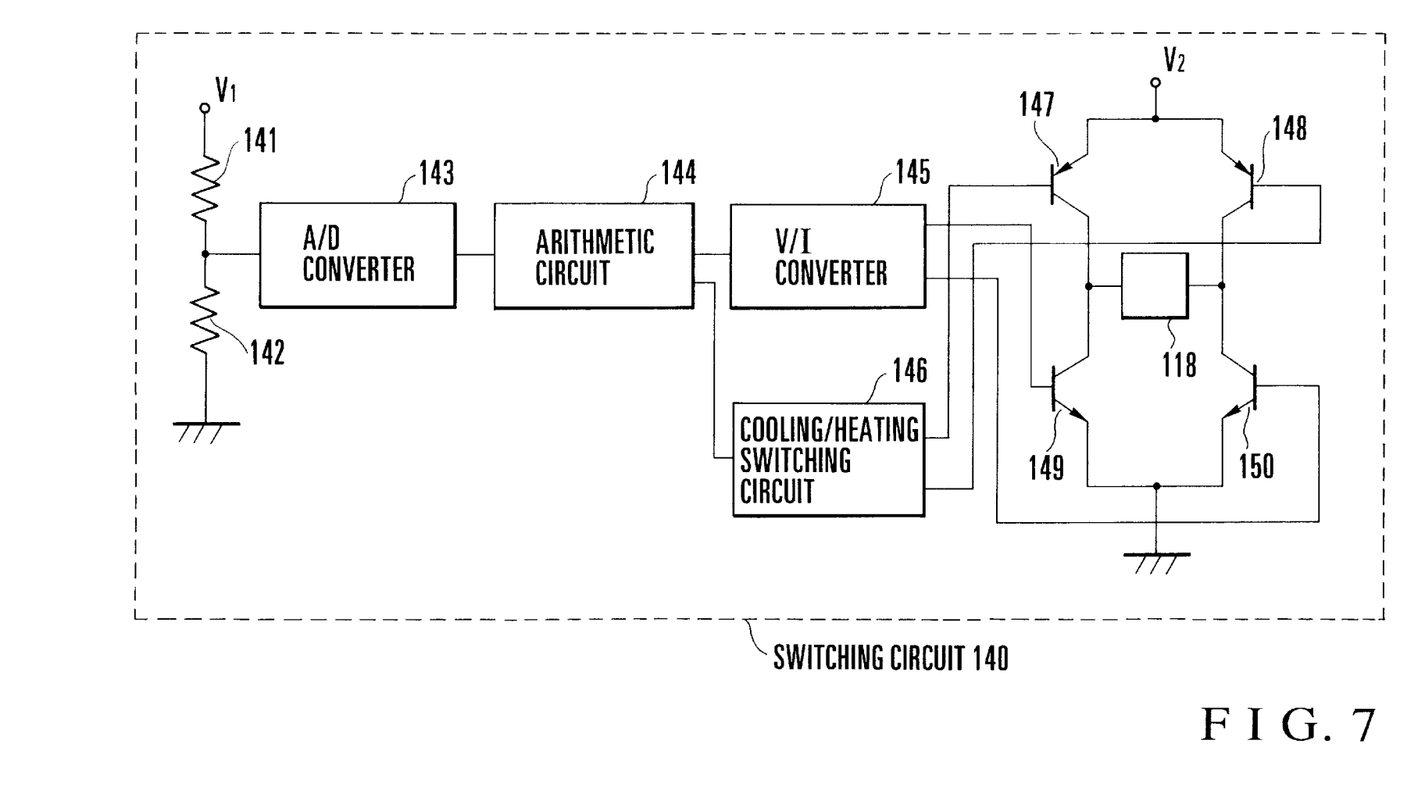
FIG. 7 is a block diagram of a temperature control circuit for keeping the temperature of a semiconductor laser element shown in FIG. 1 constant.

FIG. 7 is a block diagram of a temperature control circuit 140 for keeping the temperature of the semiconductor laser element 101 constant. Referring to FIG. 7, a voltage obtained by dividing a voltage V1 through a resistor 141 and a thermistor resistor 142 representing the resistance of the thermistor 102 is input to an A/D converter 143. An output from the A/D converter 143 is input to an arithmetic circuit 144. An output from the arithmetic circuit 144 is input to a V/I converter 145 and a cooling/heating switching circuit 146. An output from the V/I converter 145 is selectively supplied to the bases of transistors 149 and 150. An output from the cooling/heating switching circuit 146 is complementarily supplied to transistors 147 and 148. A voltage V2 is applied to the emitters of the transistors 147 and 148, and the collectors of the transistors 147 and 148 are connected to the collectors of the transistors 149 and 150, respectively. The emitters of the transistors 149 and 150 are grounded. The temperature controller 118 is connected between the connection point between the transistors 147 and 149 and the connection point between the transistors 148 and 150.

The operation of the temperature control circuit 140 will be described below. The input and output voltages of the arithmetic circuit 144 are preset such that a Peltier current corresponding to the thermistor resistance value shown in FIG. 6 flows when the ambient temperature changes to change the value of the thermistor resistor 142. The Peltier current is flowed by the V/I converter 145. At this time, the direction of the Peltier current is controlled by switching the output from the cooling/heating switching circuit 146 to the transistor 147 or 148. As described above, the temperature of the semiconductor laser element 101 is kept constant regardless of the change in ambient temperature. In this embodiment, the thermistor 102 is fixed to the base 130 constituting the bottom surface of the package 107. However, the thermistor 102 may be fixed to the side surface of the package 107.

Figure 8:
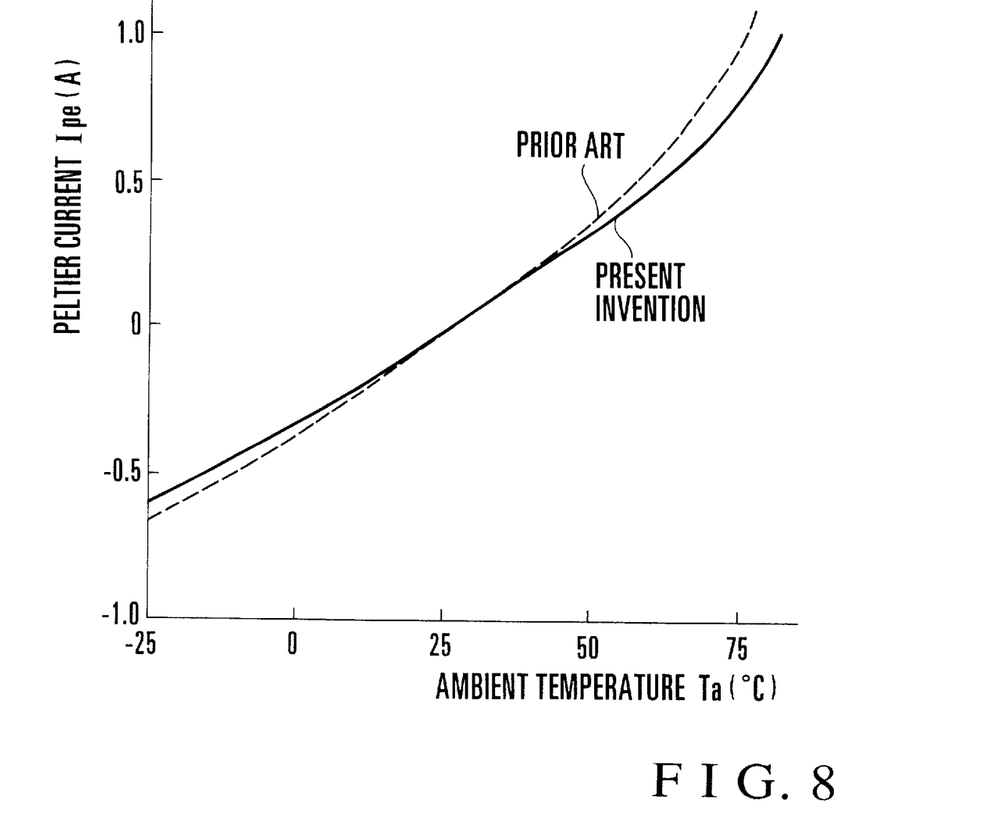
FIG. 8 is a graph showing the temperature control characteristics of the temperature-controlled semiconductor laser module according to the present invention.

FIG. 8 shows the temperature control characteristics of the semiconductor laser module according to the present invention. The Peltier current consumed upon a change in ambient temperature is smaller than that of the conventional case indicated by the dotted line. For example, when the ambient temperature is 75° C., the Peltier current is reduced 20%.

As has been described above, according to the present invention, the thermistor is fixed to the bottom surface or inner wall of the package, and the lead wires of the thermistor are connected to the package. By employing this arrangement, heat transfer from the bottom surface of the package to the temperature control target through the lead wires of the conventional thermistor can be prevented, and the temperature control characteristics can be improved.

As a result, cooling efficiency and heating efficiency can be improved, quick temperature control can be performed, and the power consumption required for temperature control can be reduced.

What is claimed is:

1. A temperature-controlled semiconductor laser apparatus comprising:

a semiconductor laser element for emitting a laser beam;

an optical fiber for receiving the laser beam emitted from said semiconductor laser element;

cooling/heating means for cooling and heating said semiconductor laser element to keep said semiconductor element at a preset temperature;

temperature detection means for detecting an ambient temperature of said semiconductor laser element; and accommodation means for accommodating at least said semiconductor laser element and said cooling/heating means in a sealed state, wherein the accommodation means includes an inner wall, and said temperature detection means is mounted on the inner wall of said accommodation means, the accommodation means further having at least one set of lead terminals to which the temperature detection means is electrically connected such that it is electrically and thermally isolated from the semiconductor laser element and the heating and cooling means.

2. An apparatus according to claim 1, wherein the inner wall of the accommodation means includes a bottom surface, and said temperature detection means is mounted on the bottom surface of the inner wall of said accommodation means.

3. An apparatus according to claim 2, wherein said accommodation means is a package having a base at a bottom thereof, and said temperature detection means is fixed to said base of said package.

4. An apparatus according to claim 3, wherein said cooling/heating means comprises an upper substrate and a lower substrate, said lower substrate being separated from said temperature detection means and fixed to said base of said accommodation means, and said upper substrate having an upper surface on which said semiconductor laser element is fixed through a carrier and a heat sink.

5. An apparatus according to claim 1, further comprising temperature control means for controlling said cooling/heating means on the basis of a difference between a temperature detected by said detection means and the preset temperature.

6. An apparatus according to claim 5, wherein said temperature control means comprises arithmetic means for obtaining a control signal for said cooling/heating means in accordance with the temperature detected by said detection means.

7. An apparatus according to claim 1, wherein said cooling/heating means comprises Peltier elements for performing heat generation or heat absorption depending on a direction of a current.

8. An apparatus according to claim 1, further comprising a signal output unit fixed to said accommodation means to extract a detection signal from said temperature detection means outside said accommodation means.

9. A temperature control method for a temperature-controlled semiconductor laser apparatus comprising a semiconductor laser element for emitting a laser beam, an optical fiber for receiving the laser beam emitted from said semiconductor laser element, a cooling/heating unit for cooling and heating said semiconductor laser element to keep said semiconductor element at a preset temperature, a temperature detector for detecting an ambient temperature of said semiconductor laser element, and a package for accommodating at least said semiconductor laser element and said cooling/heating unit in a sealed state and having said temperature detector mounted on an inner wall of said package, said package further having at least one set of lead terminals to which the temperature detector is electrically connected, the method comprising the steps of:

electrically and thermally isolating the temperature detector from the semiconductor laser element and the heating/cooling unit;

causing said temperature detector to detect a temperature of said inner wall of said package;

generating a control signal for said cooling/heating unit in accordance with the detected temperature of said inner wall of said package; and controlling said cooling/heating unit in accordance with the generated control signal to control a temperature of said semiconductor laser element.

10. A method according to claim 9, wherein the step of generating a control signal for said cooling/heating unit comprises the steps of:

detecting a difference between the preset temperature and the temperature of said inner wall of said package which is detected by said temperature detector; and generating the control signal for said cooling/heating unit on the basis of the detected difference.

* * * * *